US006917213B2

United States Patent
Oosawa et al.

(10) Patent No.: US 6,917,213 B2
(45) Date of Patent: *Jul. 12, 2005

(54) SEMICONDUCTOR INTEGRATED CIRCUIT DEVICE

(75) Inventors: Hirotaka Oosawa, Isesaki (JP);
Masumi Kasahara, Takasaki (JP);
Kazuo Watanabe, Takasaki (JP)

(73) Assignee: Renesas Technology Corporation, Tokyo (JP)

( * ) Notice: Subject to any disclaimer, the term of this patent is extended or adjusted under 35 U.S.C. 154(b) by 12 days.

This patent is subject to a terminal disclaimer.

(21) Appl. No.: 10/615,787

(22) Filed: Jul. 10, 2003

(65) Prior Publication Data

US 2004/0104732 A1 Jun. 3, 2004

Related U.S. Application Data

(63) Continuation of application No. 10/036,460, filed on Jan. 7, 2002, now Pat. No. 6,597,191.

(30) Foreign Application Priority Data

Jan. 15, 2001 (JP) ....................................... 2001-006558

(51) Int. Cl.[7] .............................................. G01R 31/02
(52) U.S. Cl. ..................... 324/763; 324/158.1; 324/765; 324/754; 438/17; 714/719
(58) Field of Search .............................. 324/763, 158.1, 324/754, 765, 769; 438/14, 17, 18; 714/719, 720, 724, 716, 712, 715; 371/22.1, 22.3, 22.6, 22.5; 257/40, 48

(56) References Cited

U.S. PATENT DOCUMENTS

5,900,739 A    5/1999   Gaglani
6,298,458 B1  10/2001  Cranford, Jr. et al.

*Primary Examiner*—Vinh Nguyen
*Assistant Examiner*—Jimmy Nguyen
(74) *Attorney, Agent, or Firm*—Reed Smith L.L.P; Stanley P. Fisher, Esq.; Juan Carlos A. Marquez, Esq.

(57) ABSTRACT

An input/output pin for test corresponding to a test circuit of the digital section is used in common as the input/output pin for normal operation of the analog section. The selection switches are respectively provided between the relevant analog pin and analog circuit and on a signal line up to the test circuit of the digital section from the relevant analog pin and the switches are provided at both end portions of the signal line between the test circuit of digital section and the input/output pin for common use in order to fix the voltage of the signal line to the predetermined voltage such as the ground voltage during the normal operation. Thereby, it is possible in a semiconductor integrated circuit having the analog and digital sections to eliminate adverse effect, even if the input/output pin for testing corresponding to the test circuit of the digital section is used in common as the input/output pin for normal operation of the analog section, from the analog circuit due to the noise which is generated in the digital section and is then transferred to the analog circuit through the signal path up to the analog input/output pin connected to the test circuit from this test circuit of the digital section.

9 Claims, 5 Drawing Sheets

SEMICONDUCTOR INTEGRATED CIRCUIT DEVICE

This application is a continuation application of U.S. application Ser. No. 10/036,460 filed on Jan. 7, 2002 U.S. Pat. No. 6,597,191.

BACKGROUND OF THE INVENTION

The present invention relates to a noise reduction technique for a semiconductor integrated circuit and more specifically to a technique which may be effectively adapted to a semiconductor integrated circuit device comprising an analog section and a digital section for common use of signal input pin for test and signal input/output pin for usual operation, for example, to a technique which may be effectively used for LSI (Large Scale Integrated circuit) which is used in a hand-held telephone set for radio communication to process the transmitting and receiving signals.

There has been proposed a technique to reduce the number of pins through common use of the signal input/output pin for test and the signal input/output pin for normal operation in a semiconductor integrated circuit mounting a test circuit. Moreover, in recent years, an LSI comprising the analog and digital sections, in which an analog circuit and a digital circuit are mounted on the same semiconductor chip, has also been proposed in response to further improvement in packing density of LSI.

In such LSI comprising the analog and digital circuits, when it is required to use in common the signal input/output pin for testing and the signal input/output pin for normal operation, the input/output pin for testing corresponding to the test circuit of the digital section and the input/output pin for testing corresponding to the test circuit of analog section have been provided individually in order to prevent deterioration in accuracy due to noise leakage to the analog section from the test circuit of the digital section because the analog circuit requires a higher degree of accuracy. Namely, it has been avoided to use in common the input/output pin for testing corresponding to the test circuit of the digital section and the input/output pin for usual operation of the analog section.

SUMMARY OF THE INVENTION

However, when the number of pins required for normal operation increases corresponding to progress in the packing density of LSIs, it has been required to use the input/output pin for normal operation of the analog section as the input/output pin for testing corresponding to the test circuit because of the necessity in reducing in package size through a reduction in the total number of pins.

Therefore, the inventors of the present invention have investigated using in common the input/output pin for testing corresponding to the test circuit of the digital section and the input/output pin for normal operation of the analog section. At the beginning, the inventors have thought, on the occasion of using the pin usually used as the input/output of the analog section as the input/output pin for testing corresponding to the test circuit of the digital section, there is no influence on the analog section from the digital section, if the test circuit is turned OFF in the normal operation mode because there is no exchange of signals between the analog input/output terminal and digital section.

However, as a result of detailed investigations, it has been found that if the test circuit is turned OFF in the normal operation mode, a noise generated in the digital section is transferred through the signal path up to the analog input/output pin connected with the test circuit from the test circuit of the digital section, resulting in adverse effects on the analog circuit.

It is therefore an object of the present invention to eliminate the adverse effect of noise, on a semiconductor integrated circuit comprising the analog and digital sections, that is generated in the digital section and transferred to the analog circuit through the signal path extended from the test circuit of the digital section up to the analog input/output pin connected with such g test circuit even in the case that the input/output pin for testing corresponding to the test circuit of the digital section is also used in common as the input/output pin for normal operation of the analog section.

The aforementioned and the other objects and features of the present invention will become apparent from the description of the present specification and the accompanying drawings.

Typical inventions among the inventions disclosed in this specification are briefly explained as follows.

Namely, in a semiconductor integrated circuit of the structure that the analog circuit and digital circuit are formed on one semiconductor substrate and the external terminal of the analog circuit is used in common as the external terminal of the digital circuit, selection switches are respectively provided in the course of the wiring connecting between the external terminal and the analog circuit and the wiring connecting between the external terminal and the digital circuit and a voltage fixing means, for fixing the relevant wiring to the predetermined voltage under the condition that the relevant selection switch is shut off, is connected in the side nearer to the digital circuit than the selection switch of the wiring connecting between the external terminal and the digital circuit.

According to the means explained above, when the external terminal for common use is connected to the analog circuit, the wiring is disconnected from the digital circuit and is connected between the external terminals and the digital circuit is fixed to the predetermined voltage. Therefore, noise generated in the digital circuit and noise leaked to the wiring from the peripheral circuits thereof are absorbed. Thereby, even when the external terminal is used in common with the analog circuit and digital circuit, transfer of noise to the analog circuit from the digital circuit can be prevented.

Moreover, a voltage fixing mans for fixing the relevant wiring to the predetermined voltage under the condition that the relevant selection switch is shut off is connected respectively to the side nearer to the digital circuit than the selection switch of the wiring connecting between the external terminal and the digital circuit and to the side nearer to the selection switch. Thereby, if the eternal terminal is isolated from the digital circuit and thereby the wiring connecting these elements becomes longer, the voltage of the wiring can be fixed respectively at both ends of wiring with the voltage fixing means and accordingly the noise generated in the digital circuit and noise leaked to the wiring from the peripheral area can be absorbed effectively and thereby influence of noise on the analog circuit can be lowered.

Moreover, there is provided a structure that the terminal and wiring for supplying the power source voltage to both analog circuit and digital circuit are formed individually, the voltage fixing means nearer to the digital circuit is capable of fixing the voltage of wiring to the power source voltage of the digital circuit and the voltage fixing means nearer to the selection switch is capable of fixing the voltage of wiring to the power source voltage of the analog circuit. Thereby, it can be prevented that the analog circuit is influenced with the power supply noise of the digital circuit through the analog circuit and that noise generated with operation of the digital circuit is transferred to the analog circuit through the wiring connecting between the external terminal and the digital circuit and the power supply line of the analog circuit.

In addition, a semiconductor substrate explained above is preferably formed of a multilayer structure in which a semiconductor layer is formed on a supporting substrate via an insulation layer and elements forming the analog circuit and the element forming the digital circuit are surrounded preferably with a dielectric insulation band formed to reach the insulation layer through the semiconductor layer. Thereby, noise generated between elements forming the circuit can be lowered.

Moreover, the wiring connecting between the selection switch and the digital circuit among those connecting the external terminals and digital circuit is preferably formed at the upper part of the semiconductor region sandwiched between two insulated separation bands formed up to the insulation layer through the semiconductor layer. Thereby, amount of noise appearing on the wiring connecting the external terminals of common use and the digital circuit resulting from the peripheral circuits of this wiring can be reduced.

Moreover, the voltage fixing means is formed on the surface of the semiconductor region sandwiched between two insulated separation bands in which the wiring connecting between the selection switch and digital circuit is formed. Thereby, the amount of noise appearing on the voltage fixing means and resulting from the peripheral circuits can be reduced and as a result, noise to be transferred to the analog circuit can also be reduced.

In addition, the external terminal of the analog circuit is structured for common use as the terminal for inputting and outputting the signals of the test circuit of the digital circuit. Since the test circuit of the digital circuit is not operated during the normal operation of the analog circuit, the terminals can be used in common and any influence is applied to the usual operation because it is not required to select the terminals for normal operation.

Moreover, the other invention of the present specification is a semiconductor integrated circuit for processing various signals comprising an oscillation control circuit for generating control voltages of a first oscillation circuit for generating a first oscillation signal and of a second oscillation circuit for generating a second oscillation signal, an amplifying circuit for amplifying a receiving signal, a first mixer circuit for combining the amplified signal and the first oscillation signal to convert the frequency, a receiving analog circuit including a demodulation circuit for demodulating the signal frequency-converted in the first mixer circuit, a modulation circuit for modulating a transmitting signal, a transmitting analog circuit including a second mixer circuit for combining the modulated signal and the second oscillation signal to convert the frequency, a control digital circuit for controlling the receiving analog circuit and transmitting analog circuit and a test circuit for outputting a signal from the control digital circuit, whereby at least an external terminal for inputting an analog input signal to the transmitting analog circuit or outputting an analog output signal from the transmitting analog circuit is used in common as the external terminal for outputting the signal from the test circuit, the selection switches are respectively provided in the course of the wiring connecting the external terminal and analog circuit and the wiring connecting the external terminal and the digital circuit, and a voltage fixing mans for fixing the relevant wiring to the predetermined voltage under the condition that relevant selection switch is in the shut-off condition is connected in the side nearer to the digital circuit than the selection switch of the wiring connecting the external terminal and digital circuit.

According to the means explained above, since the wiring disconnected from the test circuit of the control digital circuit and connected between the external terminal and test circuit of digital circuit is fixed to the predetermined voltage when the external terminal of common use is connected to the transmitting analog circuit, the noise generated in the digital circuit and noise appearing on the wiring from the peripheral circuits of wiring are absorbed and thereby even if the external terminal is used in common with the transmitting analog circuit and test circuit of the control digital circuit, transfer of noise to the transmitting analog circuit from the test circuit of the digital circuit can be prevented.

DETAILED DESCRIPTION OF THE PREFERRED EMBODIMENT

A preferred embodiment of the present invention will be explained with reference to the accompanying drawings.

Figure 1:
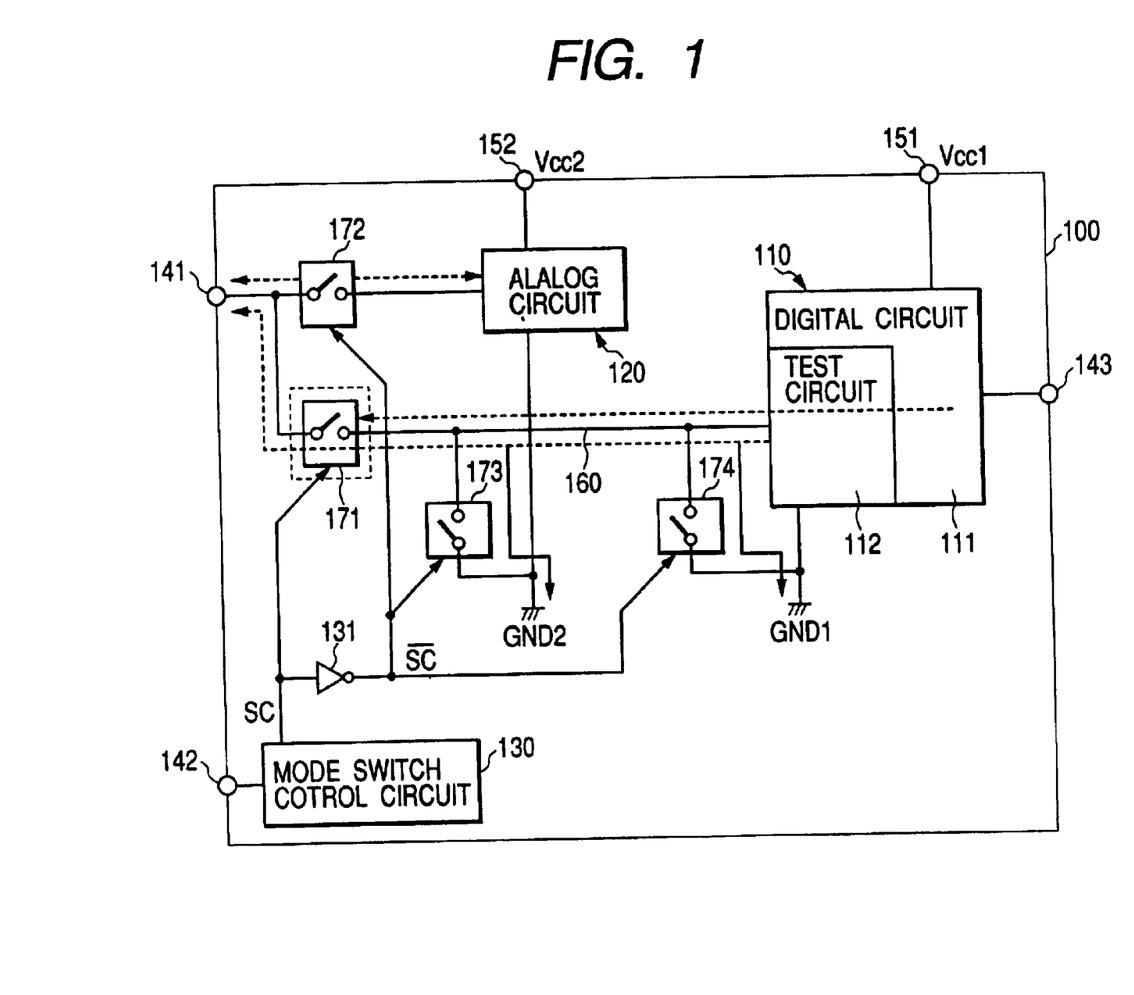
FIG. 1 is a block diagram showing an embodiment of the semiconductor integrated circuit comprising analog circuits and digital circuits to which the present invention is adapted.

FIG. 1 shows an embodiment of a semiconductor integrated circuit comprising analog and digital circuits of the present invention. Although not particularly restricted, each circuit block shown in FIG. 1 is formed on one semiconductor chip such as a single crystal silicon.

In FIG. 1, 100 designates a semiconductor chip; 110, a digital section where the digital circuit is provided; 120, an analog section where the analog circuit is provided; and 130, a mode selection control circuit for switching the operation mode in the chip depending on a mode setting signal supplied from an external circuit. The digital section 110 is provided with a digital circuit 111 and test circuit 112 for testing this digital circuit. Moreover, 141 designates an analog input/output pin for inputting a signal to the analog section 120 and outputting a signal from the analog section during the normal operation; 142, a mode setting pin for inputting a mode setting signal MODE to the mode selection control circuit 130, and 143, a signal input/output pin during the normal operation of the digital circuit 111.

The digital section 110 and analog section 120 are respectively structured to be operated with different power supply systems (including the case where the level is same). More practically, the digital section 110 is connected with the power supply wiring extended from the power supply terminal 151 for receiving the power supply voltage Vcc1 supplied from the external circuit of the chip, while the analog section 120 is structured to be connected to the wiring extended from the power supply terminal 152 for receiving the power supply voltage Vcc2 supplied from the external circuit of the chip and to receive the power supply from the individual power supply terminals.

As explained above, it can be prevented by providing individual power supply terminals and power supply wirings for the digital section 110 and analog section 120 that variations in the power supply diffuses to the analog section 120 due to the operation of the digital section 110 to lower the accuracy. Moreover, it is preferable that the power supply terminals 151, 152 are connected to different lead terminals provided to a package. Moreover, the ground lines and external terminals for supplying the ground potential are also individually formed for the digital section 110 and analog section 120.

In the semiconductor integrated circuit of this embodiment, a signal line 160 for outputting the operating condition in the test circuit 112 to the external side from the analog input/output pin 141 is provided between the analog input/output pin 141 and test circuit of the digital section 110. Moreover, selection switches 171, 172 for controlling ON and OFF the transmission of signals are respectively provided in the side nearer to the analog input/output pin 141 of the signal line 160 and between the analog input/output pin 141 and analog section 120. These selection switches 171, 172 are controlled to ON and OFF conditions. Namely, the selection switch 171 is turned ON and the switch 172 is turned OFF during the test with the test circuit of the digital section with the control signal SC from the mode selection control circuit 130 and the signal /SC converted with an inverter 131, while the selection switch 171 is turned OFF and the switch 172 is turned ON during the normal operation.

Moreover, in this embodiment, the switches 173, 174 are also provided respectively to the selection switch 171 side of the signal line 160 and at the area near the test circuit 112 of the digital section in view of absorbing noise by fixing, to the constant voltage such as the ground potential, the voltage of the signal line 160. These noise absorbing switches 173, 174 are turned OFF during the test with the test circuit of the digital section with the control signal from the mode selection control circuit 130, while being turned ON during the normal operation. The ground lines as the constant voltage lines connected with the noise absorbing switches 173, 174 are respectively defined as follows. Namely, the noise absorbing switch 173 is used as the ground line GND2 in the analog circuit side, while the switch 174 as the ground line GND1 in the digital circuit side.

Thereby, the operating condition of the test circuit 112 can be outputted to external circuits from the analog input/output pin 141 through the signal line 160 because the signal line 160 is not fixed, during the test operation, to the ground voltage with the switches 173, 174 of the OFF condition and the selection switch 171 is turned ON. Meanwhile, during the usual operation, since the selection switch 171 is turned OFF and the switches 173, 174 are turned ON, the signal line 160 is fixed the ground voltage.

As a result, noise appearing on the signal line 160 from the digital section 110 during the usual operation and noise appearing from the peripheral circuits because the signal line 160 works as an antenna can be absorbed by the ground voltage via the switches 173, 174. Therefore, transfer of noises appearing from the digital section 110 to the analog section 120 via the signal line 160 can be prevented and thereby accuracy of the analog section 120 can be improved. Accordingly, a high precision LSI (Large Scale Integrated circuit) comprising the analog and digital sections can be realized and a highly accurate analog test result can be obtained in regard to the input/output pin of the analog circuit which is used in common with the test signal of the digital section 110 even during the test at the time of delivery of products can be obtained.

In above explanation, the analog input/output pin 141 which is used in common also with the test circuit 112 of the digital section 110 is used to output the operating condition of the test circuit 112, but when the analog input/output pin 141 is also used in common as the pin for inputting the test signal to the test circuit 112 of the digital section 110, it can also be prevented that noise from the digital section 110 is transferred to the analog section 120 via the signal line 160 because the noise absorbing switches 173, 174 are provided and are then turned ON during the normal operation and noise appearing from the peripheral circuits is transferred to the analog section 120 because the signal line 160 works as an antenna.

Moreover, the analog input/output pin 141 may also be used as the pin for outputting the test result in place of using it as the pin for monitoring the operating condition of the test circuit 112 of the digital section 110 from the external side. In addition, in the embodiment of FIG. 1, the operation mode of the semiconductor integrated circuit is set by giving the mode setting signal MODE from the external side of chip, but the mode setting is not restricted to this system. For example, it is also possible to introduce the system for setting the mode to a mode register by inputting thereto a mode setting value from an ordinary input/output pin (data input/output pin) after providing, for example, the mode setting register thereto.

Figure 2:
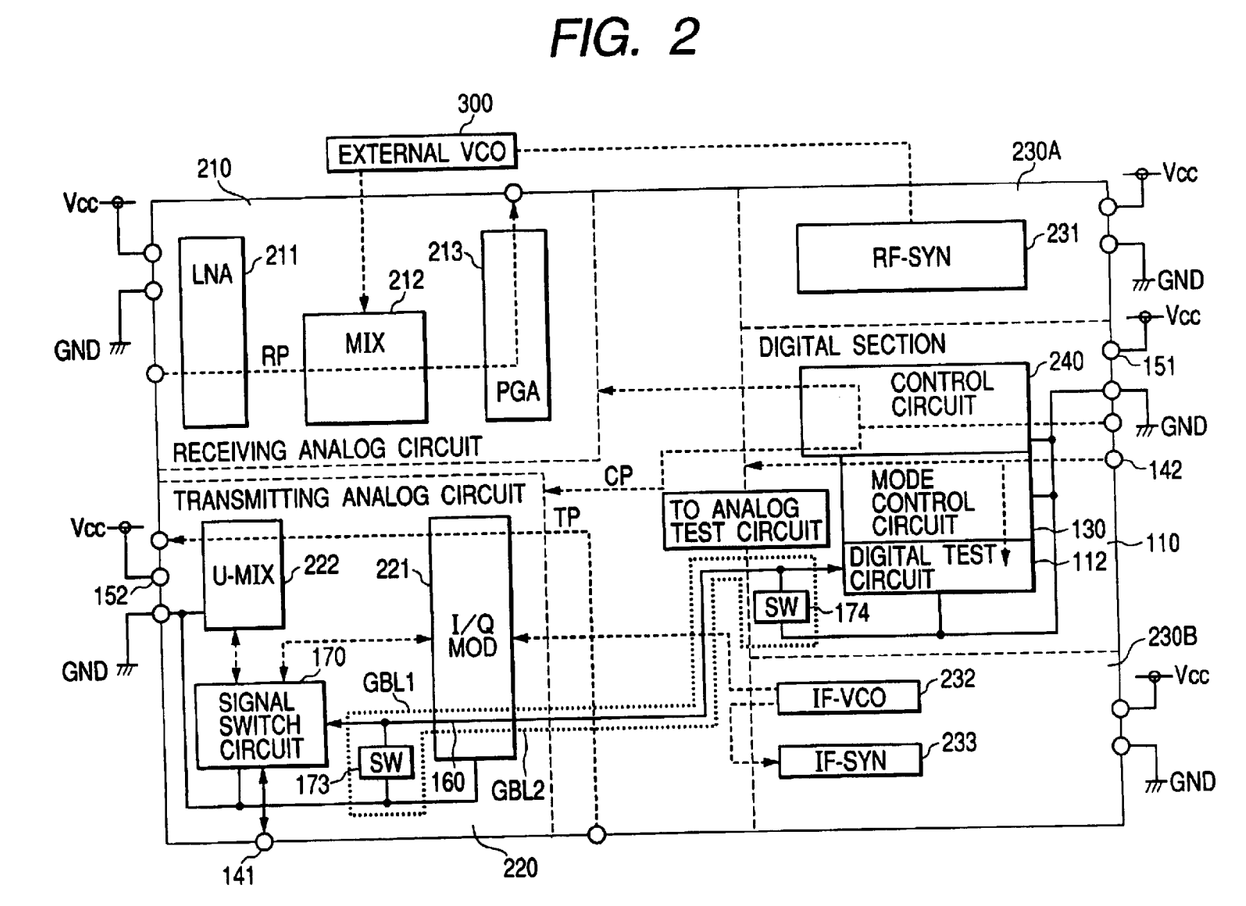
FIG. 2 is a block diagram showing an embodiment wherein the present invention is adapted to a semiconductor integrated circuit for signal process forming a radio communication system of a direct conversion system to be used for a hand-held telephone set.

FIG. 2 shows an embodiment to which the present invention is adapted to a semiconductor integrated circuit for signal process forming a radio communication system of the direct conversion system to be used in a hand-held telephone set.

In FIG. 2, 210 designates a receiving circuit for amplifying and demodulating an input receiving signal; 220, a transmitting circuit for modulating a transmitting signal and converting the frequency thereof; 230A, 230B, oscillation circuits for generating local oscillation signals required for these receiving circuit 210 and transmitting circuit 220; and 240, a control circuit for controlling the receiving circuit 210 and transmitting circuit 220. In this embodiment, the receiving circuit 210 and transmitting circuit 220 are formed as the analog circuit and the control circuit 240 is formed as the digital circuit.

The receiving circuit 210 includes a low noise amplifying circuit (LNA) 211 for amplifying an input receiving signal, a mixer (MIX) 212 for direct down-conversion of the combined receiving signal amplified with LNA and the local oscillation signal from the oscillation circuit 230A to the signal of base-band frequency (I/Q) and for demodulation of the signal and a programmable gain amplifier (PGA) 213 which can control the gain thereof by amplifying the down-converted receiving signal to the desired level.

Although not particularly restricted, this embodiment is structured so that the externally provided VCO (voltage controlled oscillator) 300 is controlled to oscillate in the predetermined frequency with an oscillation control signal generated from the receiving circuit 230A and such oscillation signal is supplied to the mixer 212 within the chip and is then mixed with the receiving signal. VCO 300 can also be formed on the same chip. The high frequency oscillation signal having no dependence on temperature can be generated by externally providing VCO. The signal amplified with PGA213 is supplied to the baseband process circuit not shown and is then processed therein for conversion into an audio signal.

The transmitting circuit 220 is formed of a modulator (I/Q MOD) 221 for modulating the signal inputted as the baseband signal (I/Q) converted from the audio signal in the baseband signal (I/Q) not shown and a mixer (U-MIX) 222 for up-conversion of the modulated signal up to the predetermined transmitting frequency by combining such modulated signal and the oscillation signal from the oscillating circuit 230B or the like. The mixer 222 may be an ordinary mixer circuit but can also be formed as a circuit which considers the oscillation signal supplied from the oscillating circuit 230B as the carrier and can output directly such carrier with inclusion of the signal modulated in the modulator (I/Q MOD) 221.

The oscillating circuit 230 is provided with a synthesizer (RF-SYN) 231 for generating a control voltage for the external VCO 300 by comparing a phase difference from the externally supplied reference signal, a voltage controlled oscillator (IF-VCO) 232 for generating an oscillation signal supplied to the transmitting mixer 222 and a synthesizer (IF-SYN) 233 for generating a control voltage for such IF-VCO. The oscillation signal of IF-VCO232 is fed back to the IF-SYN233 to form a closed loop circuit called PLL (Phase Locked Loop).

In this embodiment, the terminal for inputting the control signal of the transmitting circuit 220 and outputting, for the purpose of monitor, the analog voltage within the transmitting circuit 220 is defined as the analog input/output pin 141 to be used in common for input and output of the test signal and this analog input/output pin 141 is connected with a signal section circuit 170 consisting of the selection switches 171 and 172 shown in FIG. 1. In addition, the signal line 160 for outputting the operating condition of the test circuit 112 is provided between the signal selection circuit 170 and the test circuit 112 of the digital circuit such as the control circuit 240 provided in the digital section 110. Moreover, the switches 173, 174 for fixing the voltage of the relevant signal line 160 to the constant voltage such as the ground voltage are respectively provided at the starting end and trailing end of the signal line 160, namely at the areas near the signal selection circuit 170 and near the test circuit 112.

In addition, the semiconductor integrated circuit for signal processing of this embodiment is individually provided with the power supply terminals (151, 152, . . . ) and the ground terminal respectively corresponding to the receiving circuit 210, transmitting circuit 220, oscillating circuit 230 and control circuit 240. Moreover, the oscillating circuit 230 is also provided with individual power supply terminals corresponding to the receiving synthesizer RF-SYN and transmitting synthesizer IF-SYN. Thereby, the power supply noise of the- oscillating circuit 230 and control circuit 240 is not easily transferred to the receiving circuit 210 and the transmitting circuit 220 as the analog circuit via the power supply line. From the point of view of reducing the power supply noise for the analog circuit, the power supply pin provided to the package may be used in common for the oscillating circuit 230 and control circuit 240, except for the power supply terminal of the chip (pad). Namely, the individual pads may be connected to the same power-supply pin with a bonding wire.

In FIG. 2, a broken line RP indicates a transfer route of the receiving signal in the receiving circuit 210, a broken line TP indicates a transfer route of the transmitting signal in the transmitting circuit 220 and a broken line CP indicates a transfer route of the control signal for the receiving circuit 210 and transmitting circuit 220 in the control circuit 240.

Moreover, in the semiconductor integrated circuit for signal process of this embodiment, the signal line 160 for connecting the signal selection circuit 170 and the test circuit 112, of the digital circuit 111 are formed in the narrower island region sandwiched between two guard band lines GBL1, GBL2 formed on the chip surface.

Figure 3:
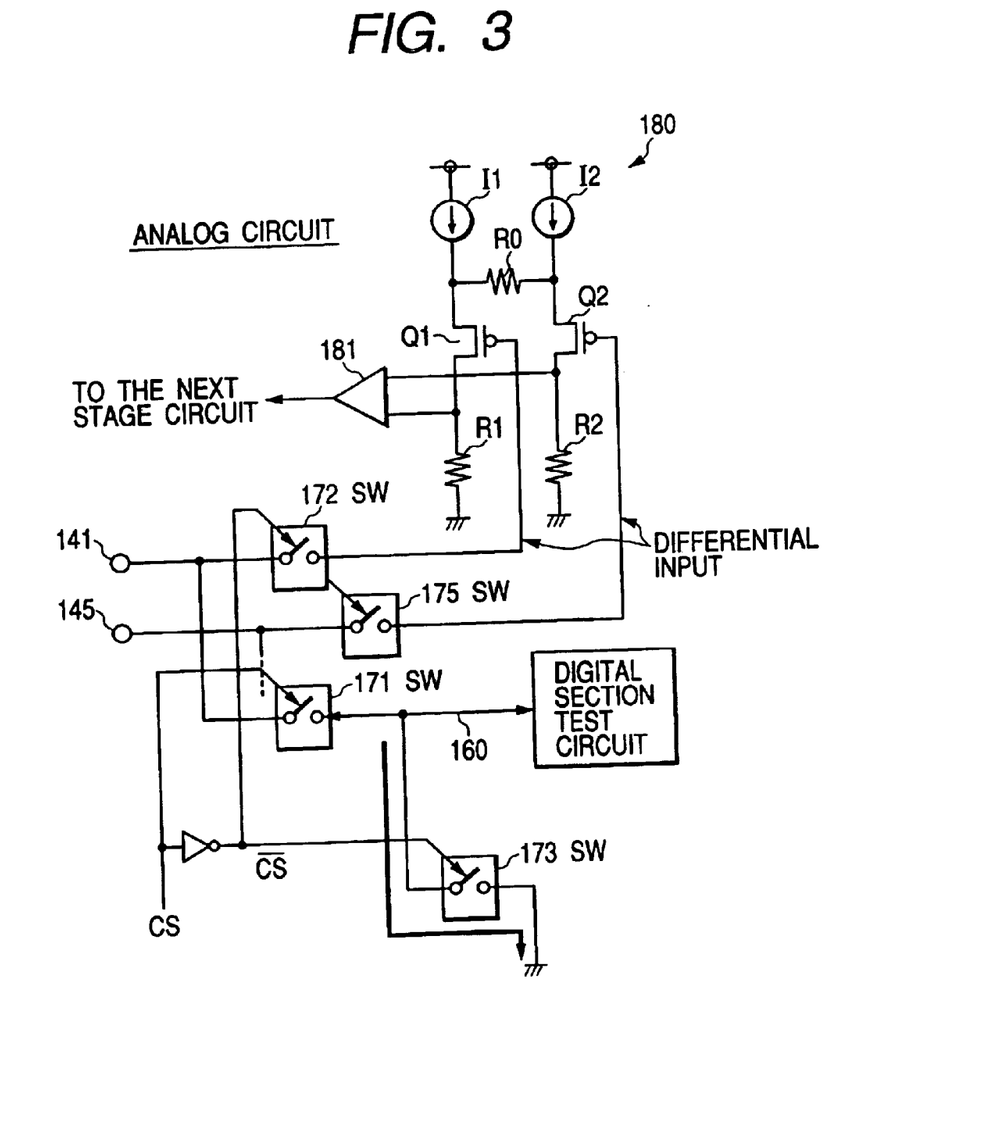
FIG. 3 is a circuit diagram showing a practical example of an analog circuit connected to an analog input/output pin used in common from a signal selection circuit and a test circuit in the semiconductor integrated circuit of the embodiment of FIG. 2.

FIG. 3 shows a practical example of analog circuit connected to the analog input/output pin 141 used in common with the signal selection circuit 170 and test circuit 112 in the semiconductor integrated circuit of the embodiment of FIG. 2.

Although not particularly restricted, in an example of FIG. 3, an input pin of the analog control signal for the transmitting circuit 220 from the baseband process circuit is used as the common pin 141 and this pin 141 is then connected with a differential amplifying circuit 180. In FIG. 3, 160 designates a signal line for testing connected to the test circuit 112 of the digital section; 171, a selection switch connected between the signal line 160 and common pin 141; 172, a selection switch connected between the common pin 141 and the differential amplifying circuit 180 as the analog circuit; and 173, a noise absorbing switch connected between the signal line 160 and the ground point (ground line).

In this embodiment, since the analog control signal inputted to the pin 141 is a differential signal, a selection switch 175 similar to the selection switch 171 is also provided between another pin 145 provided in pair with the pin 141 and the differential amplifying circuit 180. Although not shown, a selection switch similar to the selection switch 172 corresponding to the pin 145, a signal line similar to the signal line 160 and a switch similar to the noise absorbing switch 173 are also provided respectively.

The differential amplifying circuit 180 is formed from a pair of MOSFETs Q1, Q2 for receiving respectively at the gate terminals, the differential control signals inputted to the common pins 141, 145 during the normal operation, constant current sources I1, I2 connected to the source terminal side of the MOSFETs Q1, Q2 a resistor RO connected between the source terminals of Q1, Q2 and drain resistors R1, R2 connected between the drain terminals of Q1, Q2 and the ground point. The input differential signal amplified with this differential amplifying circuit 180 is then supplied to the modulator (I/Q MOD) 221 and the mixer (U-MIX) 222 shown in the embodiment of FIG. 2 via a buffer amplifier 181.

Figure 4:
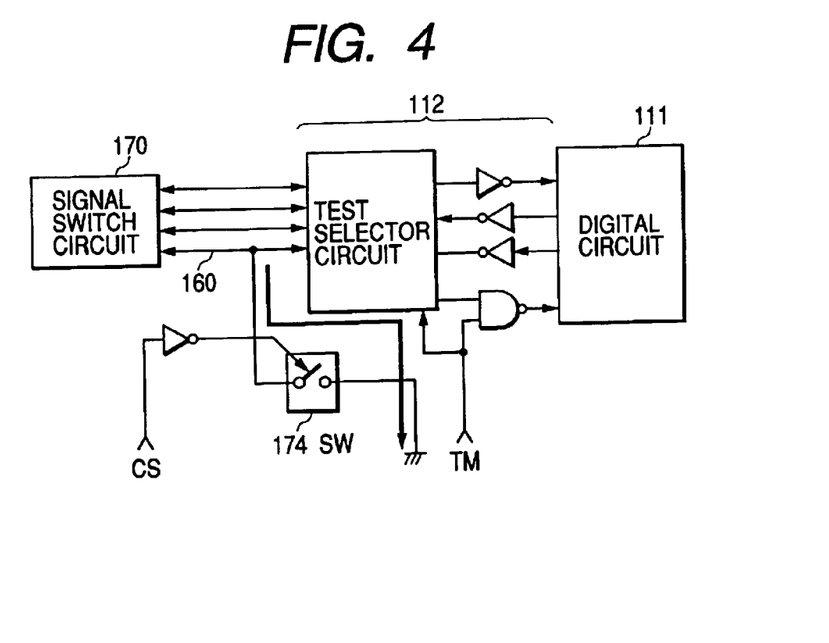
FIG. 4 is a circuit diagram showing a practical example of a test circuit connected to the common analog input/output pin of the semiconductor integrated circuit of the embodiment of FIG. 2.

FIG. 4 shows a practical example of the test circuit 112 connected to the analog input/output pin 141 for testing in the semiconductor integrated circuit of the embodiment of FIG. 2.

Although not apparent from FIG. 2, in this embodiment, four signal lines 160 are provided to connect the test circuit 112 and the signal selection circuit 170 and each signal line is connected with the selection switch 171 and noise absorbing switches 173, 174. The test circuit 112 is composed of a test selector circuit SEL for selecting, with a signal TM indicating the test mode from the mode selection control circuit 130, any one of the four signal lines 160 to output the monitor signal from the digital circuit 111 to the analog input/output pin 141 and for selecting, on the contrary, the test signal to the digital circuit 111 inputted from the analog input/output pin 141 and then supplying such test signal to the digital circuit 111 and a logic gate circuit such as inverter and NAND gate or the like.

As explained above, since the signal line 160 connecting the common analog input/output pin for test from the test circuit of the digital section is provided with switches 173, 174 in this embodiment, noise transferred to the analog section 120 from the digital section 110 via the signal line 160 can be absorbed. Here an LSI comprising the analog and digital sections provides the possibility of transferring noise to the analog section from the digital section via the substrate, but in this embodiment, such noise diffused from the substrate can be suppressed as much as possible through the employment of a separation between the power supply line and power supply terminal explained above, a device structure called the SOI (Silicon On Insulator) explained hereafter and U-groove separation structure.

Figure 5:
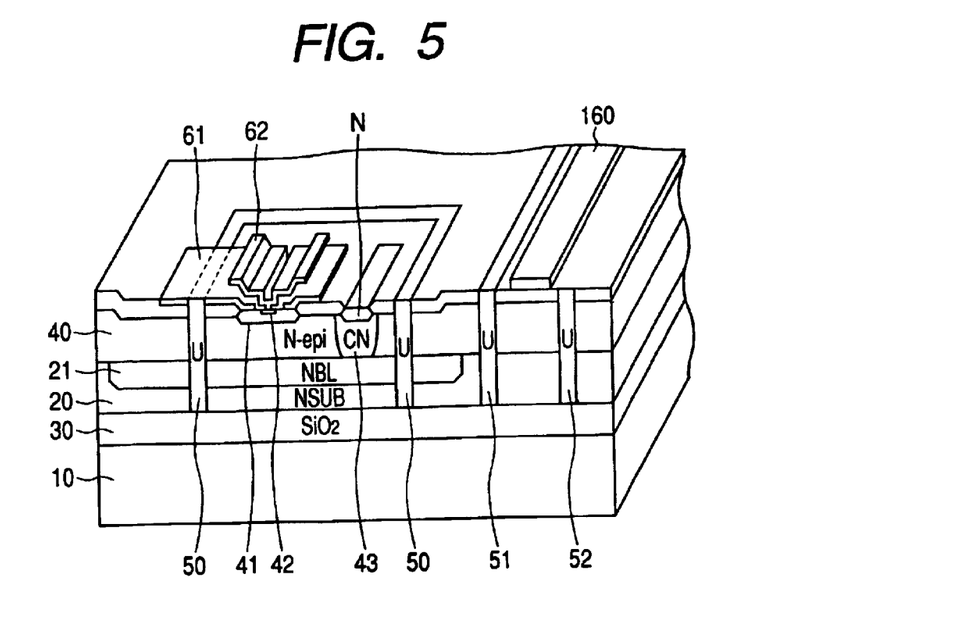
FIG. 5 is a cross-sectional view showing an example of a bipolar transistor to form an analog circuit in the LSI including analog/digital circuits of the embodiment.

FIG. 5 shows a structure of the bipolar transistor forming an analog circuit in the LSI comprising the analog and digital sections of the embodiment explained above and FIG. 6 shows a structure of the MOSFET forming the digital circuit and selection switches 171, 172 and noise absorbing switches 173, 174.

In FIG. 5, 10 designates a supporting substrate consisting of a single crystal silicon; 20, a semiconductor base material consisting of a single crystal silicon formed or adhered on the supporting substrate 10 via the insulation film 30 such as a silicon oxide film; 40, an epitaxial layer formed on the surface of the semiconductor base material 30 with the gas phase epitaxial growth method or the like. Here, an n-type embedded layer 21 which becomes a collector region through the epitaxial growth of n-type impurity introduced previously in high concentration is formed to the area in which a bipolar transistor is formed and the U-groove isolation band 50 for element isolation is formed surrounding the peripheral area of the element in such a manner that the isolation band reaches the lower insulation film 30 through the n-type embedded layer 21 and the epitaxial layer 40 formed thereon. The U-groove isolation band 50 can be formed by digging the groove from the substrate surface with a dry-etching method or the like and then filling the groove with an insulator such as the silicon oxide or the like.

On the surface of epitaxial layer 40 surrounded with this U-groove isolation band 50, a p-type diffusion layer 41 as the base region and an n-type diffusion layer 42 as the emitter region are formed and moreover an n-type region 43 as the collector lead-out region is also formed in such as manner as reaching the n-type embedded layer 21 through the epitaxial layer 40. Numeral 61 designates a base electrode formed of a conductor such as aluminum in contact with the p-type diffusion layer 41 as the base region; 62, an emitter electrode formed of a conductor such as aluminum in contact with the n-type diffusion layer 42 as the emitter region.

Moreover, in this embodiment, two groove isolation bands 51, 52 reaching the lower insulation film 30 through the epitaxial layer 40 are formed in parallel and the signal lines 160 for connecting the test circuit 112 to the analog input/output pin via the insulation film such as the silicon oxide film are formed on the narrow island type epitaxial layer 40 surrounded by such U-groove isolation bands 51, 52. These U-groove isolation bands 51, 52 are extended, in FIG. 1, up to the area near the test circuit 112 from the selection switch 171. As explained above, formation at the upper part of the narrow island type epitaxial layer 40 sandwiched by two U-groove isolation bands 51, 52 in which the signal lines 160 are formed in parallel to connect the test circuit to the analog input/output pin can prevent transfer of noise to the analog circuit through the signal lines 160 due to voltage variations or the like generated when the elements forming the peripheral circuits operate.

Figure 6:
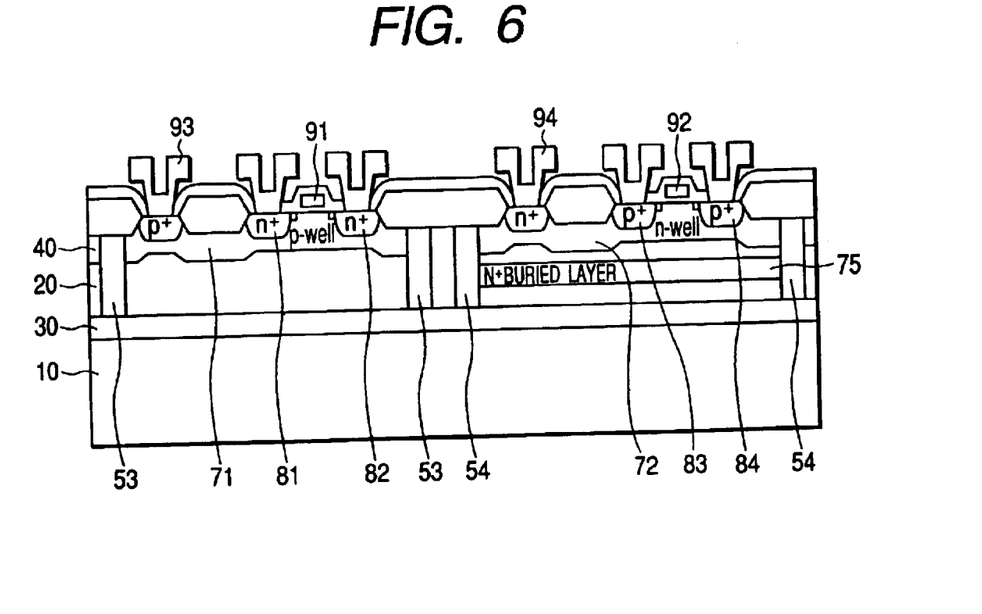
FIG. 6 is a cross-sectional view showing an example of the structure of a MOSFET to form a digital circuit and a detection switch and a noise absorbing switch of the embodiment of FIG. 1.

Moreover, in this embodiment, the MOSFET forming the digital circuit and MOSFET functioning as the selection switches 171, 172 and noise absorbing switches 173, 174 are also formed, as shown in FIG. 6, at the surface of the epitaxial layer surrounded by the U-groove isolation bands 53, 54. The U-groove isolation bands 53, 54 for isolating this MOSFET are also formed to surround the entire part of the circumference of the element region as in the case of the U-groove isolation band 50 of the bipolar transistor of FIG. 5.

However, the noise absorbing switches 173, 174 of this embodiment are formed at the surface of an island type epitaxial layer 40 sandwiched by the U-groove isolation bands 51, 52 provided to form the low noise region to allocate the signal lines 160 and these U-groove isolation bands 51, 52 can be used as the element isolation regions of the switches 173, 174.

The selection switch 171 may also be formed at the surface of the island type epitaxial layer 40 sandwiched by the U-groove isolation bands 51, 52. In addition, the selection switches 171, 172 may also be formed on the epitaxial layer 40 provided between the U-groove isolation bands 51 and 52. Namely, the above switches may be formed in the region surrounded by the isolation band 50 as in the case of a transistor. In this case, since the wiring for connecting the transistor can be laid in short length, transfer of noise can further be reduced.

In FIG. 6, numeral 71 designates a P-well region in which an N-channel MOSFET is formed; 72, an N-well region in which a P-channel MOSFET is formed; 75, a high concentration barrier layer provided in the epitaxial layer in which the N-well 72 is formed; 81, 82, source and drain regions of the N-channel MOSFET formed at the surface of the P-well region 71; 83, 84, source and drain regions of the P-channel MOSFET formed at the surface of the N-well region 72; 91, 92, gate electrodes consisting of a polysilicon layer formed on the surface of substrate between the source and drain via the insulation film; and 93, 94, electrodes for supplying the voltage to give inverse bias across the source and drain to the well regions 71, 72. In this embodiment, the barrier layer 75 explained above is provided to realize low resistance but this barrier layer can be eliminated.

As shown in FIG. 5 and FIG. 6, since the bipolar transistor and MOSFET are respectively formed, for isolation from the other elements, in the island type semiconductor region surrounded by the U-groove isolation bands 50, 53, 54 formed to reach the lower insulation film 30 through the epitaxial layer 40, transfer of noise to the other elements through the substrate when each element is operated can be prevented.

The noise appearing from the signal lines provided in the course of the selection switch is usually considered as a problem in the present invention is usually not so much considered as a problem because this noise level is comparatively lower than the noise diffused from a substrate, but the noise appearing from the signal lines 160 in this embodiment has a relatively large influence because the noise diffused from the substrate is reduced through employment of the SOI structure and U-groove isolation structure. Therefore, the present invention can be adapted effectively in such a case where the analog input/output pin is used in common with the digital circuit in the LSI comprising the analog and digital sections of the SOI structure.

The present invention has been explained in practical based on the preferred embodiment thereof, but the present invention is not limited to the above embodiment and allows of course various changes and modifications within the scope of the invention but not departing from the claims thereof. For example, in the above embodiment, the SOI substrate is used as a semiconductor substrate but a similar effect can also be achieved by adapting the present invention even when an ordinary silicon substrate is used. Moreover, in the above embodiment, the analog input/output pin is used in common for the test circuit of the digital section, but the present invention can also be adapted to the case where the analog input/output pin is also used in common for digital circuits other than the test circuit under the condition, for example, of usage on a time division basis.

In the above explanation, the present invention has been adapted to the LSI for signal processing to be used in radio communication systems for hand-held telephone sets of direct conversion systems which is the application field as the background of the present invention. However, the present invention is not restricted thereto and can also be widely adapted to the LSI for signal processing to be used for radio communication systems of hand-held telephone sets of super-heterodyne systems and a semiconductor integrated circuit comprising the analog and digital sections.

The effects of the typical inventions of the present invention can be summarized as follows.

That is, according to the present invention, there is provided the effect, even when the input/output pin of the signal corresponding to the digital circuit and the input/output pin of analog circuit are used in common in the semiconductor integrated circuit comprising the analog and digital sections., that the bad influence on the analog circuit by the noise generated in the digital circuit and transferred through the signal route extended up to the analog input/output pin connected with the digital circuit from this digital circuit can be eliminated.

What is claimed is:

1. A semiconductor integrated circuit comprising:

a digital circuit formed on a semiconductor substrate;

an analog circuit formed on the semiconductor substrate;

an external terminal;

a selection circuit coupled to the external terminal;

a first wiring layer provided between the selection circuit and the digital circuit;

a second wiring layer provided between the selection circuit and the analog circuit; and a voltage providing means coupled to the first wiring layer and for providing a voltage to the first wiring layer when the first wiring layer is electrically cut from the external terminal by the selection circuit.

2. A semiconductor integrated circuit according to claim 1, wherein the digital circuit has a first voltage terminal for receiving the voltage and the analog circuit has a second voltage terminal for receiving the voltage, wherein the voltage providing means includes a first switching circuit coupled between the first wiring layer and the first voltage terminal and a second switching circuit coupled between the first wiring layer and the second voltage terminal, and wherein the connection node between the second switching circuit and the first wiring layer is located between the selection circuit and the connection node between the first switching circuit and the first wiring layer.

3. A semiconductor integrated circuit according to claim 2, wherein the digital circuit is formed in a semiconductor region which is formed on the semiconductor substrate via an insulation layer, and wherein the analog circuit is formed in a semiconductor region which is formed on the semiconductor substrate via an insulation layer.

4. A semiconductor integrated circuit according to claim 2, wherein each of the first wiring layer and the second wiring layer is formed on the semiconductor substrate.

5. A semiconductor integrated circuit comprising:

a transmitting circuit including a modulation circuit for modulating a signal;

a control circuit coupled to the transmitting circuit and controlling the transmitting circuit;

a test circuit coupled the control circuit;

an external terminal being capable of transmitting a signal to be transmitted to the transmitting circuit;

a first switching circuit coupled between the external terminal and a wiring layer which is coupled to the test circuit; and a voltage providing circuit coupled to the wiring layer and providing a voltage to the wiring layer when the wiring layer is electrically cut from the external terminal.

6. A semiconductor integrated circuit according to claim 5, wherein each of the transmitting circuit, the control circuit, the test circuit and the wiring layer is formed on a semiconductor substrate.

7. A semiconductor integrated circuit according to claim 6, further comprising a second switching circuit coupled between the external terminal and the transmitting circuit.

8. A semiconductor integrated circuit according to claim 6, wherein the voltage providing circuit includes a third switching circuit coupled between the wiring layer and the voltage to be supplied to the transmitting circuit and a fourth switching circuit coupled between the wiring layer and the voltage to be supplied to the test circuit, and wherein the fourth switching circuit is located between the third switching circuit and the test circuit.

9. A semiconductor integrated circuit according to claim 8, further comprising a second switching circuit coupled between the external terminal and the transmitting circuit.

* * * * *